US012804846B2

(12) United States Patent
Lim

(10) Patent No.: US 12,804,846 B2
(45) Date of Patent: Nov. 17, 2026

(54) PROTECTIVE CASE AND AIRFLOW GENERATING METHOD THEREOF

(71) Applicant: xMEMS Labs, Inc., Santa Clara, CA (US)

(72) Inventor: Martin George Lim, Hillsborough, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 19/318,310

(22) Filed: Sep. 3, 2025

(65) Prior Publication Data

US 2026/0075750 A1 Mar. 12, 2026

Related U.S. Application Data

(60) Provisional application No. 63/692,162, filed on Sep. 8, 2024.

(51) Int. Cl.
*H05K 7/20* (2006.01)
*G06F 1/16* (2006.01)

(52) U.S. Cl.
CPC ....... *H05K 7/20172* (2013.01); *G06F 1/1629* (2025.01)

(58) Field of Classification Search
CPC . G06F 1/20; G06F 1/206; G06F 1/203; G06F 1/163; G06F 1/1656; H05K 7/20172; H05K 7/20145
See application file for complete search history.

(56) References Cited

U.S. PATENT DOCUMENTS

| | | | | |
|---|---|---|---|---|
| 10,782,742 | B1 * | 9/2020 | Spencer | G06F 1/163 |
| 2014/0153190 | A1 * | 6/2014 | Zhang | H05K 7/20172 361/694 |
| 2015/0018053 | A1 * | 1/2015 | Chou | H05K 7/20 455/575.1 |
| 2022/0225031 | A1 * | 7/2022 | Liang | G10K 15/04 |
| 2024/0128928 | A1 * | 4/2024 | Liang | G10K 15/04 |
| 2024/0276139 | A1 * | 8/2024 | Chen | H04R 7/04 |

FOREIGN PATENT DOCUMENTS

| | | | |
|---|---|---|---|
| CN | 105230141 | A | 1/2016 |
| CN | 107257636 | A | 10/2017 |
| CN | 210609324 | U | 5/2020 |
| TW | 201618635 | A | 5/2016 |

* cited by examiner

*Primary Examiner* — Adam B Dravininkas
(74) *Attorney, Agent, or Firm* — Winston Hsu

(57) ABSTRACT

A protective case and an airflow generating method thereof are disclosed to dissipate heat from a portable electronic device. The protective case includes a housing, adapted to accommodate the portable electronic device, and an airflow generating device, integrated in the housing. By providing external active cooling and protective covering functions, the protective case improves performance and reliability of the portable electronic device without requiring modifications to its internal configuration.

21 Claims, 10 Drawing Sheets

PROTECTIVE CASE AND AIRFLOW GENERATING METHOD THEREOF

CROSS REFERENCE TO RELATED APPLICATIONS

This application claims the benefit of U.S. Provisional Application No. 63/692,162, filed on Sep. 8, 2024. The content of the application is incorporated herein by reference.

BACKGROUND OF THE INVENTION

1. Field of the Invention

The present invention relates to a protective case and airflow generating method thereof, and more particularly, to a protective case and airflow generating method thereof for actively cooling electronics and the like.

2. Description of the Prior Art

Unless otherwise indicated herein, the approaches described in this section are not prior art to the claims in this application and are not admitted as prior art by inclusion in this section.

As electronic devices become smaller and more powerful due to demands from AI, 5G, and other advanced applications, cooling has become a critical challenge. The constraints of limited internal space and the need for waterproofing often rule out traditional active cooling methods (e.g., fans). Moreover, conventional passive cooling approaches including heat spreaders, vapor chambers, heat sinks, and advanced thermal materials can only keep temperatures in check. When heat cannot be dissipated effectively, systems must resort to thermal management techniques such as throttling, which can cause 50% performance hit or even lead to device shutdown. Protective cases for consumer electronics like smartphones tend to aggravate this issue by impeding heat dissipation to the surrounding environment, acting as thermal insulators.

SUMMARY OF THE INVENTION

It is therefore a primary objective of the present application to provide a protective case and airflow generating method thereof, to improve over disadvantages of the prior art.

An embodiment of the present application discloses a protective case, for a portable electronic device, comprising a housing, adapted to accommodate the portable electronic device; and an airflow generating device, integrated in the housing.

An embodiment of the present application discloses an airflow generating method, for a portable electronic device, comprising producing a net airflow; and causing air to move within a housing of a protective case; wherein an airflow generating device of the protective case is integrated into the housing adapted to accommodate a portable electronic device.

These and other objectives of the present invention will no doubt become obvious to those of ordinary skill in the art after reading the following detailed description of the preferred embodiment that is illustrated in the various figures and drawings.

DETAILED DESCRIPTION

Content of U.S. Pat. No. 12,356,141, U.S. application Ser. No. 19/007,580 and Application No. Ser. No. 19/303,389 is incorporated herein by reference.

To facilitate heat dissipation, the present invention provides a protective case, which comprises not only a housing for retaining a portable electronic device but also an airflow generating (AFG) or an air-pulse generating (APG) device, which may be referred to U.S. Pat. No. 12,356,141, U.S. application Ser. No. 19/007,580 and application Ser. No. 19/303,389. The AFG device, integrated into the housing, is actuated to generate air pulses toward or away from the portable electronic device at an ultrasonic pulse rate. The air pulses produce a net airflow, which may force air toward the housing or the surroundings and induce airflow(s) within the space between the housing and the portable electronic device retained inside. Accordingly, heat originating from the portable electronic device may be expelled to the exterior of the protective case.

To ensure significant airflow, the AFG device, which may comprise a modulating means and a demodulating means, is introduced. The modulating means generates an ultrasonic air pressure wave/variation (UAW) having an ultrasonic carrier frequency $f_{UC}$. The amplitude of the UAW is modulated according to an input signal $S_{IN}$. This amplitude modulated ultrasonic air pressure wave/variation (AMUAW) is then synchronously demodulated by the demodulating means, such that spectral components embedded in the AMUAW are shifted by integer multiples of the ultrasonic carrier frequency, $\pm n \cdot f_{UC}$, where n is a positive integer. As a result of this synchronous demodulation, spectral components of the AMUAW are partially transferred to the baseband. In this manner, the AFG device can be made compact while still creating significant airflow or air pressure to function as a (miniature) air pump or bladeless fan.

Figure 1:
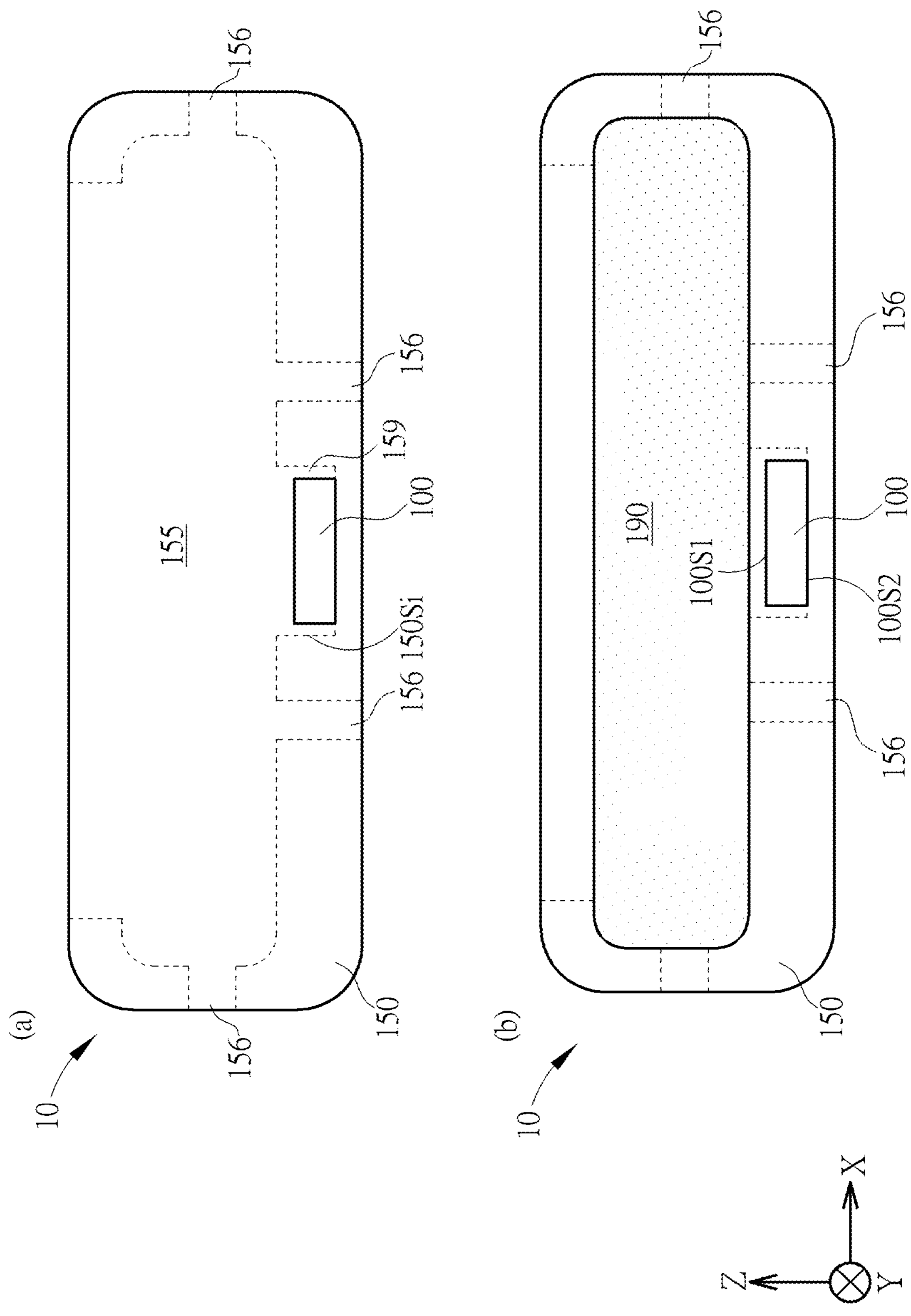
FIG. 1 and FIG. 2 illustrate side-view schematic diagrams of protective cases according to embodiments of the present invention.

For example, FIG. 1(*a*) is a side-view schematic diagram of a protective case 10, while FIG. 1(*b*) is a side-view schematic diagram of the protective case 10 combined with a portable electronic device 190 (e.g., a smartphone, a tablet, a smart watch, or a virtual reality (VR) device).

A housing 150 of the protective case 10 is configured to hold the portable electronic device 190. For example, the housing 150 is hollowed out to form an unfilled space 155, which is used to carry the portable electronic device 190. In FIG. 1, the housing 150 does not cover the top of the portable electronic device 190 (e.g., its display screen). Alternatively, the housing 150 may leave the bottom or side(s) of the portable electronic device 190 exposed while still securely accommodating the portable electronic device 190. For a portable electronic device with a shape different from that of the portable electronic device 190, the physical structure of the housing 150 may be adaptively modified to fit the portable electronic device. This shape-customizable characteristic of the housing 150 with respect to the portable electronic device 190 may enable flexible placement of an AFG device 100 within the protective case 10, allowing the AFG device 100 to be positioned according to hot spots of the portable electronic device 190 to dissipate heat efficiently.

The AFG device 100 may initiate airflow to carry heat away from the portable electronic device 190. Specifically, the AFG device 100 is actuated to generate air pulses toward or away from the protective case 10 at an ultrasonic pulse rate. These air pulses create a (first) net airflow constantly in a (first) direction (e.g., +Z or −Z) to introduce cold air (e.g., at ambient temperature) from outside into the space 155 or exhaust heated air from the AFG device 100 to the surrounding environment. The (first) airflow may induce (second) airflow(s) within the space 155, moving in direction(s) different from the (first) direction. When the portable electronic device 190 is held by the housing 150, the (second) airflow(s), constrained by the space between the portable electronic device 190 and the housing 150, may absorb and carry heat away from the portable electronic device 190, thereby cooling the portable electronic device 190. As a result, throttling may not occur or may have less chance to occur, allowing the portable electronic device 190 to increase power target(s) for its processor(s) or circuit(s).

The AFG device 100 may be affixed to the housing 150. For example, the AFG device 100 may be embedded within a recess 159 of the housing 150. A surface 100S1 of the AFG device 100 may contact an inner surface 150Si of the housing 150 to help fasten the AFG device 100 in place.

Figure 2:
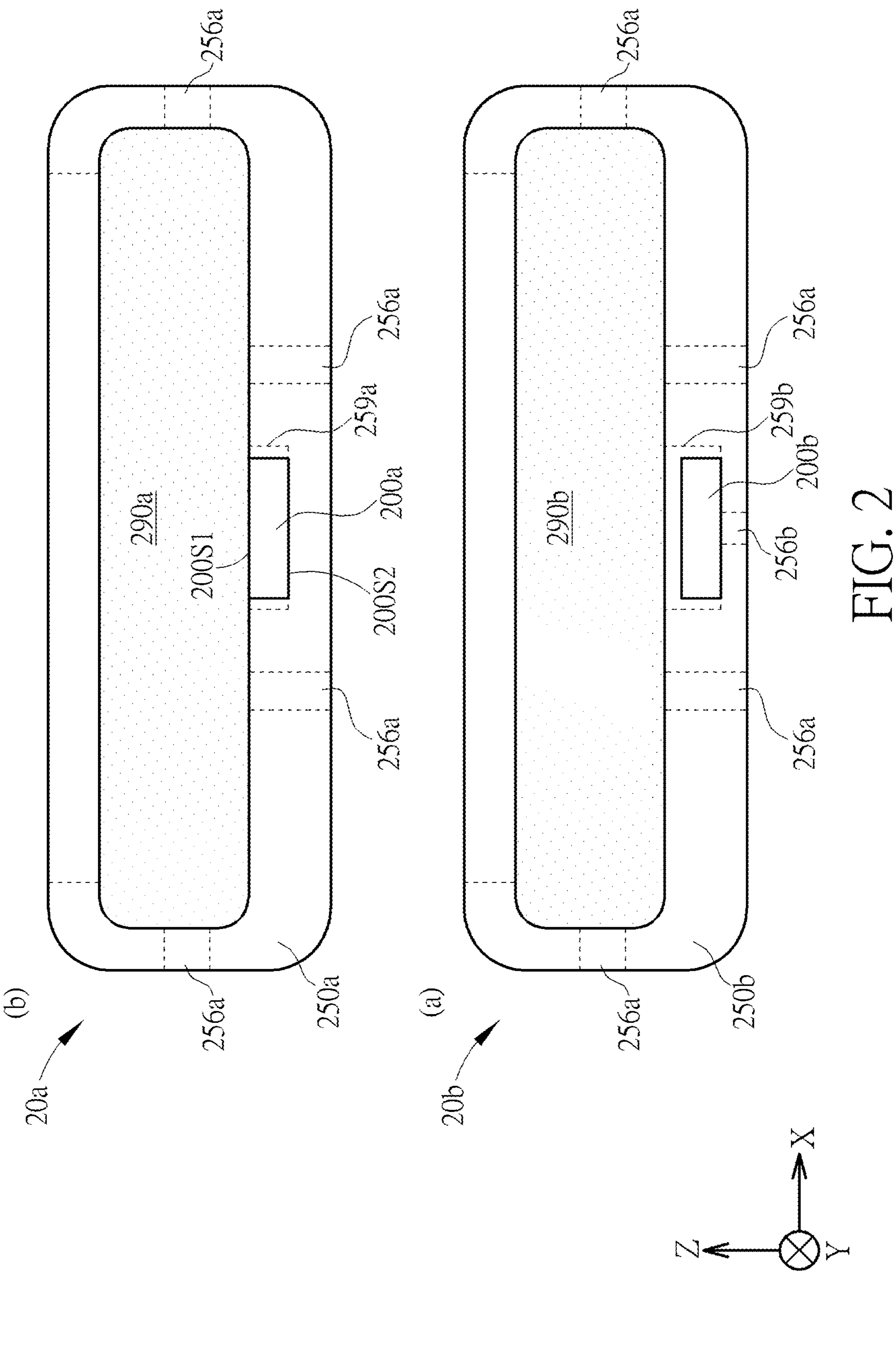

The depth of a recess may be adjusted. For example, in FIG. 1, the depth of the recess 159 may be substantially greater than the thickness of the AFG device 100, such that a surface 100S2 of the AFG device 100, opposite to the distal surface 100S1, may be disposed proximal to the portable electronic device 190 while being spaced apart therefrom. Alternatively, in FIG. 2(*a*), which is a side-view schematic diagram of a protective case 20*a* according to an embodiment of the present invention, the depth of a recess 259*a* of a housing 250*a* may be substantially close to (or less than) the thickness of a AFG device 200*a*. In this case, a proximal surface 200S2 may be in contact with a portable electronic device 290*a*. The spacing/distance(s) between the protective case 20*a* and the portable electronic device 290*a* may be configured to channel cold/heated air and absorb impact forces, thereby influencing heat dissipation efficiency or physical protection against accidental drops or shocks.

A housing may offer airflow inlet(s)/outlet(s) to facilitate heat transfer. For example, in FIG. 1, the housing 150 comprises openings 156 that allow air to enter or exit the protective case 10. Certain opening(s) 156 may be positioned near or distant from the AFG device 100. Alternatively, in FIG. 2(*b*), which is a side-view schematic diagram of a protective case 20*b* according to an embodiment of the present invention, in addition to openings 256*a*, a housing 250*b* comprises an opening 256*b*. The opening 256*b* may be aligned with or positioned corresponding to an AFG device 200*b*. When the AFG device 200*b* is in an "opened" state, a recess 259*b* may be connected to the external environment through the opening 256*b*, allowing air driven by the AFG device 200*b* to flow through.

In an embodiment, the housing 150/250*a*/250*b* may comprise air channel therein (not shown in FIG. 1 and FIG. 2) so that air pathway may be formed around the AFG device 100/200*a*/200*b*, to facilitate heat dissipation.

An AFG device may incorporate inlet(s)/outlet(s) that permit air to flow into or out of the AFG device. For example, FIG. 3(*a*) is a cross-sectional-view schematic diagram of an AFG device 300*a* according to an embodiment of the present invention. The AFG device 300*a* may comprise an opening 317*a* formed on the top of its cap structure 311*a*. Corresponding to the opening 317*a*, the AFG device 300*a* may comprise an opening 316*a* formed on its supporting board 310*a*, which is positioned opposite to the cap structure 311*a*. The opening 316*a* may be aligned with or positioned corresponding to an opening (e.g., 256*b*) of its housing (e.g., 250*b*), allowing cold/heated air to be drawn in or expelled through the two openings.

The AFG device 300*a* may comprise a film structure 304*a* (e.g., a membrane or diaphragm) positioned corresponding to the opening 316*a* or 317*a*. The film structure 304*a* may comprise flaps 301*a* and 303*a* positioned opposite to each other. The operating principle of the AFG device 300*a* is similar to those disclosed in U.S. Pat. Nos. 11,943,585 B2, 12,317,034 B2 and application Ser. No. 18/624,105, which are incorporated herein by reference. The flaps 301*a* and 303*a*, constituting a flap pair 302*a*, are actuated to perform a common-mode movement to form an AMUAW with an ultrasonic carrier frequency $f_{UC}$ (e.g., 192 or 96 kHz), which can be regarded as a modulation operation. Meanwhile, the flaps 301*a* and 303*a* are also actuated to perform a differential-mode movement to form an opening or a virtual valve (VV), at an ultrasonic opening rate (e.g., 192 or 96 kHz), which can be regarded a demodulation operation.

A slit 312*a* is formed between the flaps 301*a* and 303*a*, and the opening or the VV is created as a result of the slit 312*a*. In the present invention, the terms "slit", "opening", and "VV" share the same notation (e.g., 312*a*) as they share the same physical location and express similar concept in different aspects. The VV 312*a* is to emphasize its capability of being controlled to be opened or closed, while the opening 312*a* is to highlight its status especially when it is opened. By actuating the flaps 301*a* and 303*a*, the distance between free ends of the flaps 301*a* and 303*a* increases and the opening 312*a* or the VV 312*a* is formed.

Figure 7:
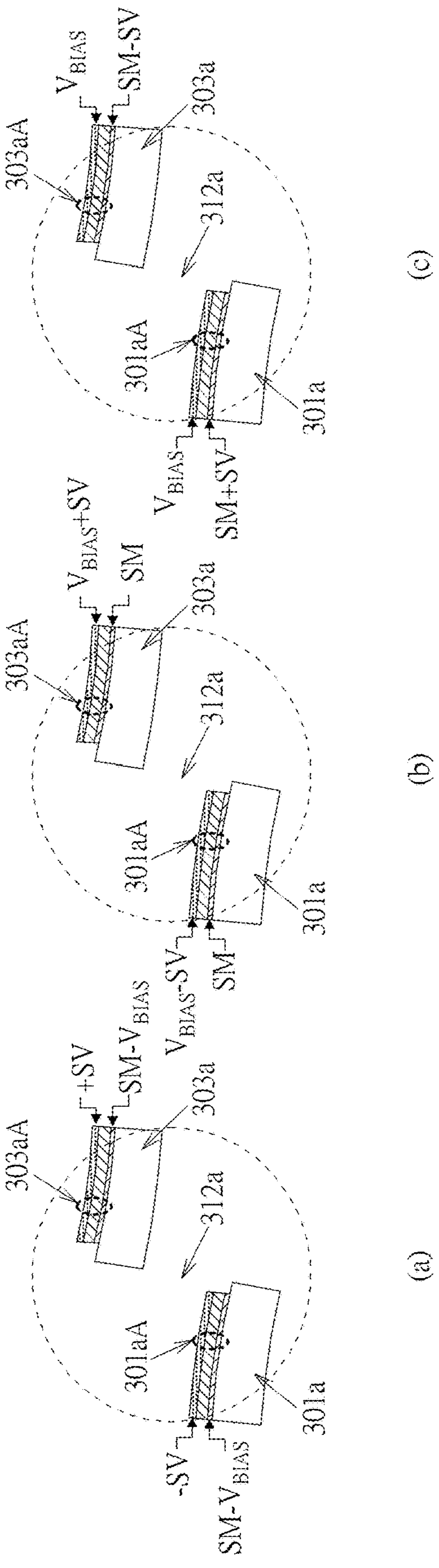
FIG. 7 illustrates schematic diagrams of wiring schemes for the AFG device shown in FIG. 5(*a*).

In the present invention, "the flaps 301*a* and 303*a* performing the common-mode movement" means that the flaps 301*a* and 303*a* are actuated to move in a common direction or actuated by a common driving signal (e.g., a modulation signal SM shown in FIG. 7). Besides, "the flaps 301*a* and 303*a* performing the differential-mode movement" means that the flaps 301*a* and 303*a* are actuated to move/bend in different/opposite directions with respect to a common reference position or actuated by a differential pair of driving signals (e.g., demodulation signals +SV and −SV shown in FIG. 7, but not limited thereto).

As the differential-mode movement (demodulation) and the common-mode movement (modulation) are simultaneously performed by the flap pair 302*a*, the in-situ and concurrent modulation-and-demodulation can be achieved through particular wiring schemes. For example, as shown in FIG. 7, the AFG device 300*a* may comprise an actuator 301*a*A disposed on the flap 301*a* and an actuator 303*a*A disposed on the flap 303*a*. Each actuator (e.g., 301*a*A or 303*a*A) comprises a top electrode and a bottom electrode. For example, FIG. 7(*a*), (*b*), and (*c*) illustrate details of a circled region marked with dashed lines shown in FIG. 3(*a*), respectively. As shown in FIGS. 7(*a*) and (*b*), the bottom electrode of the actuator 301*a*A or 303*a*A receives the modulation signal SM, and the top electrode of the actuator 301*a*A or 303*a*A receives the demodulation signals +SV and −SV, which have opposite polarities. A suitable bias voltage $V_{BIAS}$ may be applied to either the bottom electrode shown in FIG. 7(*a*) or the top electrode shown in FIG. 7(*b*). As shown in FIG. 7(*c*), one electrode of the actuator 301*a*A or 303*a*A receives both the modulation signal SM and the demodulation signal +SV or −SV (but not limited thereto), while the other electrode is properly biased.

Figure 8:
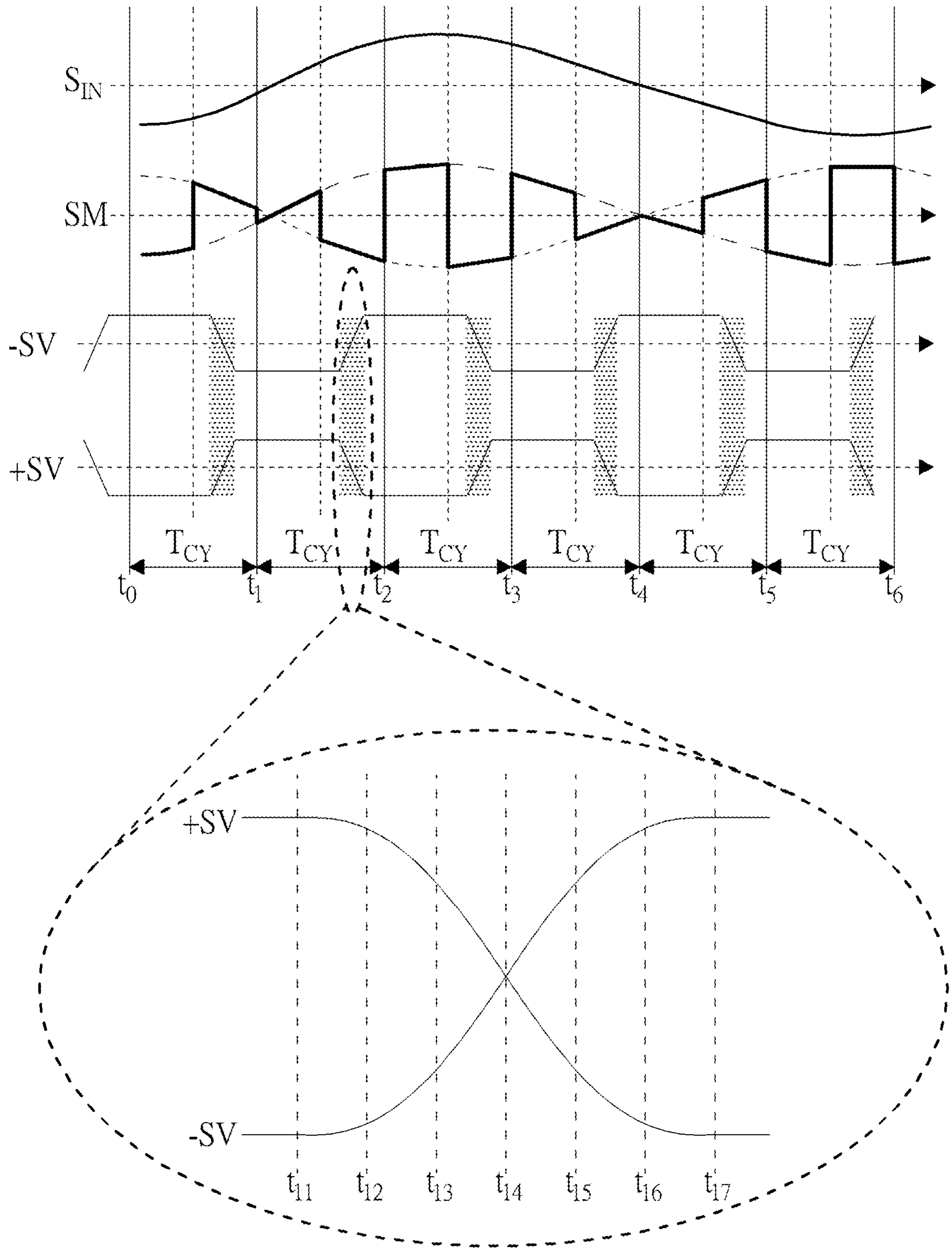
FIG. 8 is a schematic diagram of waveforms of a modulation signal and demodulation signals for the AFG device shown in FIG. 5(*a*).

The waveforms of the modulation signal SM and the demodulation signals ±SV may be referred to FIG. 8 (or similar to those shown in FIG. 8). In an embodiment shown in FIG. 8, the demodulation frequency of the demodulation signals ±SV may be a half the modulation frequency of the modulation signal SM. Specifically, the polarity of pulses in the modulation signal SM with respect to a constant voltage alternates/toggles twice in one operating cycle time $T_{CY}$. At a specific time, given that the demodulation signal +SV comprises a first pulse with a first polarity relative to a constant/average voltage, and the demodulation signal −SV comprises a second pulse with a second polarity relative to the constant/average voltage, the first and second polarities are opposite, but the first and second pulses may have equal amplitude. The polarities of pulses in the demodulation signal +SV or −SV with respect to the constant/average voltage alternates/toggles once in one operating cycle time $T_{CY}$. Consequently, the flaps 301*a* and 303*a* form the opening 312*a* at an ultrasonic opening rate of 192 kHz, and the AFG device 300*a* produces air pulses at an ultrasonic pulse rate $f_{Pulse}$ of 192 kHz. The operating cycle time $T_{CY}$ of the ultrasonic carrier frequency $f_{UC}$ may be the reciprocal of the ultrasonic pulse rate $f_{Pulse}$, namely, $T_{CY}=1/f_{Pulse}$.

In practice, the differential-mode movement (demodulation) and the common-mode movement (modulation) may not occur in time-divisional fashion. Instead, at a given time instant, the common mode displacement and the differential mode displacement may be combined to produce a net movement of the flap 301*a* or 303*a* through the aforementioned wiring schemes. For example, FIG. 9 illustrates a (symmetric movement) embodiment of the flap pair 302*a* at time instants $t_{11}$ to $t_{17}$, and the bottom corner of FIG. 8 illustrates an enlarged view of the top corner of FIG. 8 for those time instants $t_{11}$ to $t_{17}$.

Figure 9:
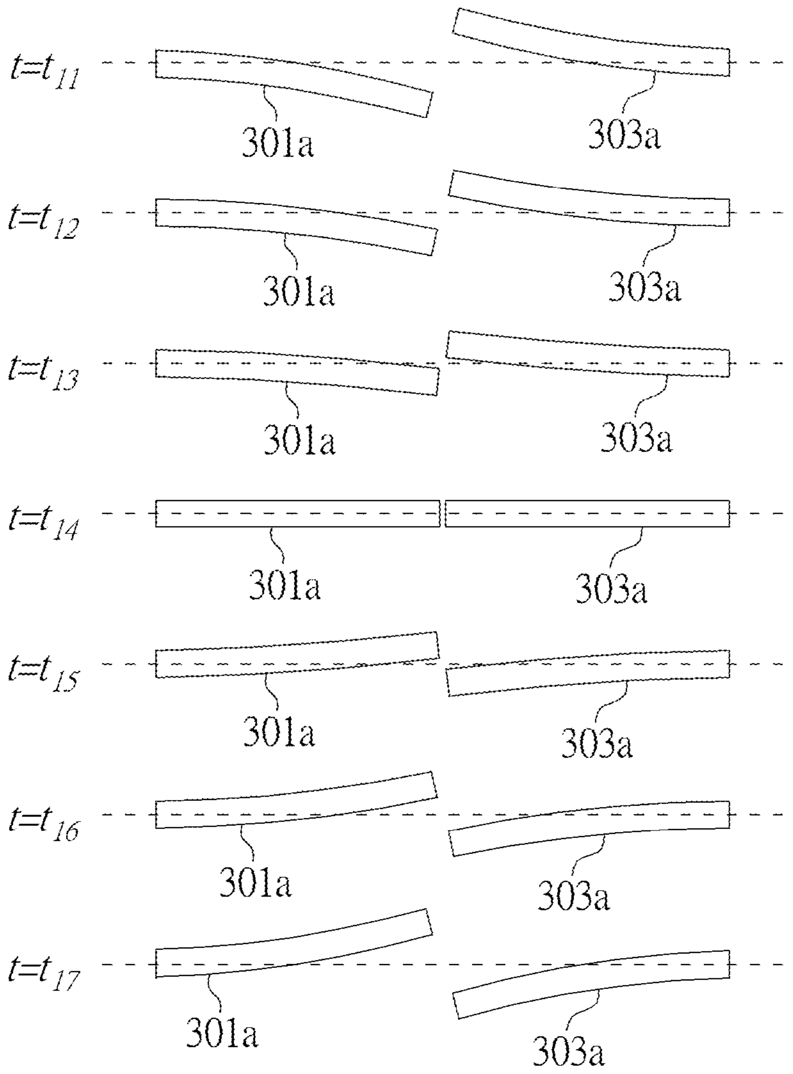
FIG. 9 is a schematic diagram of slow motion of the differential-mode movement and the common-mode movement of the AFG device shown in FIG. 5(*a*).

In FIG. 9, from the time instants $t_{14}$ to $t_{17}$, the flap 301*a* moves upward and the flap 303*a* moves downward, such that the VV 312*a* is considered to be in "opened" state (i.e., the opening 312*a* is formed) at the time instant $t_{17}$ (and remains open thereafter). Similarly, the opening 312*a* is present in the flap pair 302*a* at the time instant $t_{11}$ (and before). The common-mode movement of the flaps 301*a* and 303*a* during this time period of $t_{14}$-$t_{17}$ (or at the time instant $t_{11}$) is effectively "made to vanish".

In FIG. 9, from the time instants $t_{11}$ to $t_{14}$, the flap 301*a* moves downward and the flap 303*a* moves upward, such that the VV 312*a* is considered to be in "closed" state, meaning that the flaps 301*a* and 303*a* can be treated as a continuous membrane within this time period of $t_{11}$-$t_{14}$ and behave like one (complete membrane) in terms of membrane movement. When the VV 312*a* is in the "closed" state, the displacement difference between the free ends of the flaps 301*a* and 303*a* is less than (or equal to) the thickness of the film structure 304*a*.

The "closed" state of the VV 312*a* occurs during transitions of the differential-mode movement of the flaps 301*a* and 303*a*. Specifically, in a (first) transition time (e.g., $t_{11}$-$t_{17}$), the flap 301*a*, driven by the demodulation signal +SV, transitions from upward to downward motion; in a (second) transition time (e.g., $t_{11}$-$t_{17}$), the flap 303*a*, driven by the demodulation signal −SV, transitions from downward to upward motion. In other words, the VV 312*a* remains closed during a subinterval (e.g., $t_{13}$-$t_{15}$) within the transition times (e.g., $t_{11}$-$t_{17}$) of the flaps 301*a* and 303*a* or within the transition times (e.g., $t_{11}$-$t_{17}$) of the demodulation signals −SV and +SV—namely, the flaps 301*a* and 303*a* moving in opposite directions and the demodulation signals −SV and +SV increasing/decreasing oppositely. In short, when the VV 312*a* is closed, the flaps 301*a* and 303*a* are in motion.

The direction of a net airflow 300*a*F generated by the AFG device 300*a* may be controlled by adjusting the phase between the modulation signal SM and the demodulation signal ±SV. For example, in FIG. 9, the first transition time $t_{11}$-$t_{17}$ of the demodulation signal +SV occurs when the modulation signal SM is low. In this case, the AFG device 300*a* may produce the airflow 300*a*F in one direction. When the demodulation signal ±SV is shifted such that the transition time of the demodulation signal ±SV coincides with the time interval during which the modulation signal SM is high, the AFG device 300*a* may instead produce the airflow 300*a*F in the opposite direction.

Figure 10:
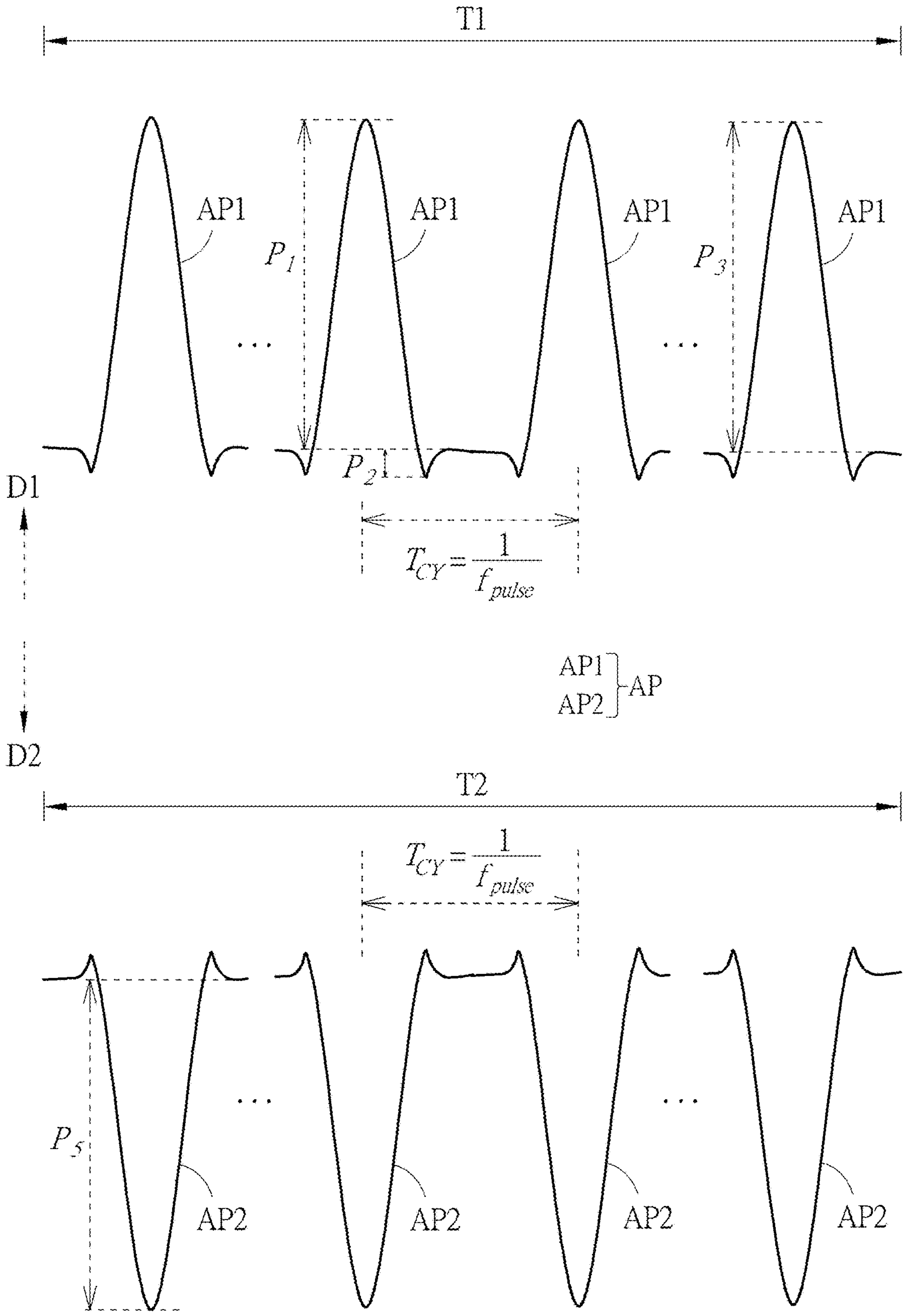
FIG. 10 is a schematic diagram of air pulses according to an embodiment of the present invention.

Alternatively, the direction of the net airflow 300*a*F may be dependent on the modulation signal SM. Specifically, the modulation signal SM may be generated according to the input signal $S_{IN}$, which may comprise alternating current (AC) component or a nonzero direct current (DC) voltage/offset. The polarity of the DC offset may be related to the direction of the net airflow 300*a*F. For example, FIG. 10 is a schematic diagram of air pulses AP according to an embodiment of the present invention. During a time interval T1, air pulses AP1 generated by the AFG device 300*a* may produce a (first) net airflow constantly in a (first) direction D1 in response to the DC offset being positive. On the other hand, during a time interval T2, air pulses AP2 generated by the AFG device 300*a* may produce a second net airflow constantly in a second direction D2, which is opposite to the first direction D1, in response to the DC offset being negative.

In other words, the AFG device 300*a* may produce a unidirectional net airflow 300*a*F. Alternatively, the AFG device 300*a* may switch the direction of its airflow 300*a*F. However, the time interval T1 or T2 (e.g., 0.5 second) is longer than the operating cycle time $T_{CY}$ or the reciprocal of the minimum audible frequency (e.g., 10 Hz), and hence the (first or second) net airflow produced by the air pulses AP1 or AP2 may be considered as constantly in a single direction D1 or D2.

The strength of the net airflow 300*a*F is controllable. Specifically, the strength of the net airflow 300*a*F may be influenced by the magnitude of the modulation signal SM. For example, the strength of the net airflow 300*a*F may be a function of the DC offset. The strength of the net airflow 300*a*F may depend on factors such as the amplitude (e.g., a peak value $P_1$, $P_3$, or $P_5$ in FIG. 10) of an individual air pulse (e.g., AP1 or AP2). The amplitudes of the air pulses AP1 or AP2 may vary from pulse to pulse or remain consistent across pulses.

In FIG. 10, an air pulse (e.g., AP1 or AP2) within one operating cycle time $T_{CY}$ is asymmetric. The degree of asymmetry may be evaluated by the ratio of $P_2$ to $P_1$, where $P_1>P_2$. Here, $P_1$ represents the peak value of a first half-cycle pulse with a first polarity relative to a reference level, and $P_2$ represents the peak value of a second half-cycle pulse with a second polarity relative to the reference level. This reference level may be corresponding to ambient condition (e.g., ambient pressure or zero airflow).

The asymmetry of an air pulse (e.g., AP1 or AP2) may indicate the presence of low frequency component(s) of the air pulses AP1 or AP2 generated by the AFG device 300*a*. The greater the asymmetric is, the stronger the baseband spectral component of the air pulses AP1 or AP2 will be.

The AFG device 300*a* may be able to produce the asymmetric air pulses AP1 or AP2 by aligning the opening timing of the VV 312*a* (in response to the demodulation signal ±SV) with the timing of acceleration of the common-mode movement of the flaps 301*a* and 303*a* (in response to the modulation-driving signal SM). Specifically, it is the demodulation operation of the AFG device 300*a* that converts the symmetric UAW, which is produced through the modulation operation, into asymmetric air pulses (e.g., AP1 or AP2). When the "opened" period of the VV 312*a* overlaps a time interval of one of the two polarities of acceleration of common-mode flap movement, the AFG device 300*a* shall produce single-ended (SE) or SE-like air pulses. Therefore, as shown in FIG. 9, the transition time of the demodulation signal ±SV may not coincide with the transition time of the modulation signal SM. In a word, pulse asymmetry relies on proper timing of opening the VV 312*a*.

The opening of the VV 312*a* does not determine the strength of the air pulses AP1 or AP2, but influences how strong the "near net-zero pressure" effect is. When the opening of the VV 312*a* is wide, the "net-zero pressure" effect becomes more pronounced, the auto-neutralization is complete, and the asymmetry is more obvious, resulting in a significant baseband signal.

Figure 3:
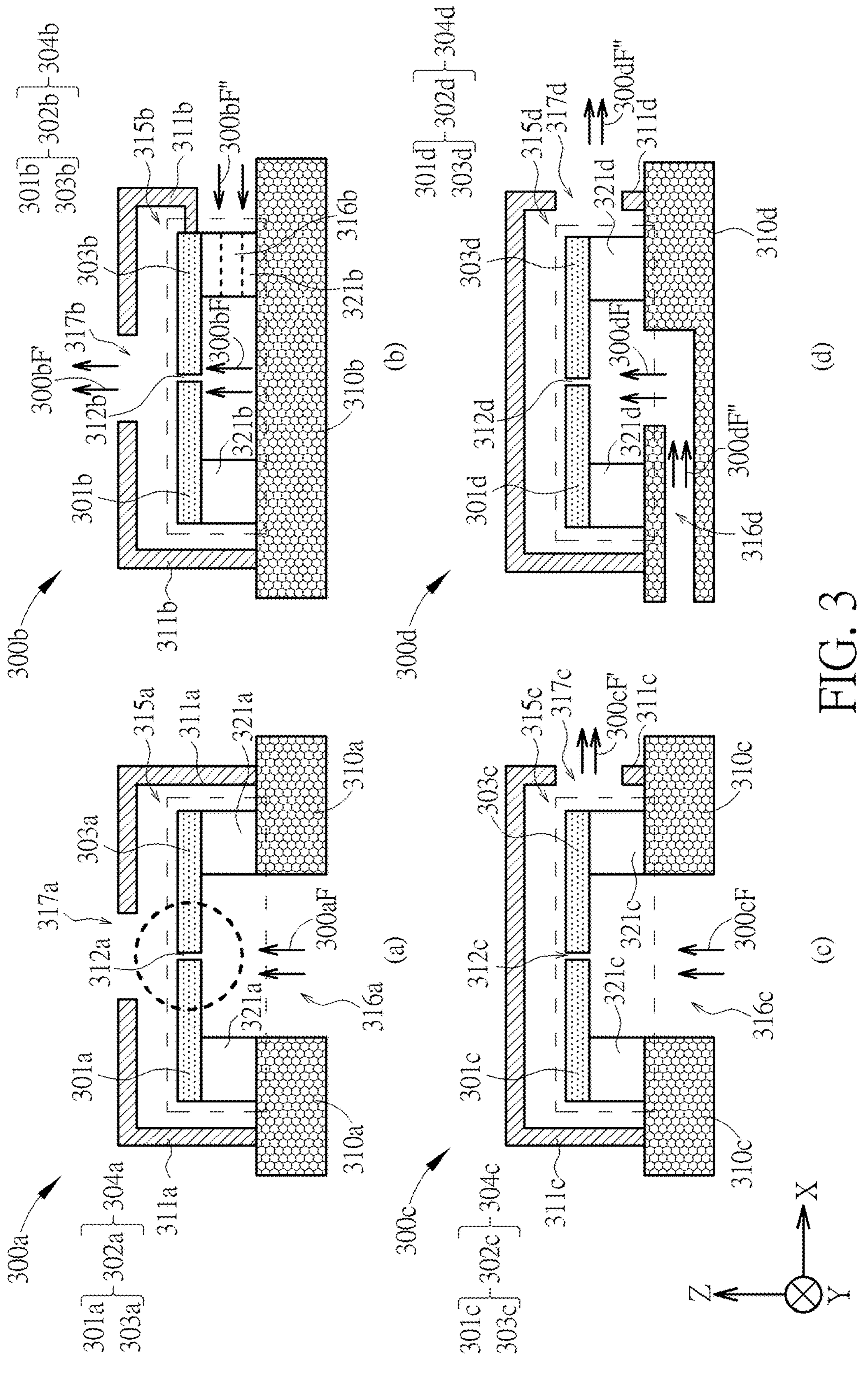
FIG. 3 illustrates cross-sectional-view schematic diagrams of AFG devices according to embodiments of the present invention.

The AFG device 300*a* may be configured/constructed using various techniques, depending on the application requirements. In FIG. 3(*a*), a chamber 315*a* is defined between a cap structure 311*a* and the film structure 304*a*. The film structure 304*a*, supported by a supporting structure 321*a*, may be fabricated using a MEMS (Micro Electro Mechanical Systems) fabrication process. A silicon (Si) substrate with a thickness of 250-500 micrometers may be etched to form the supporting structure 321*a*. On the top of this Si substrate, a thin layer, typically 3-6 micrometers in thickness, made of silicon on insulator (SOI) or POLY on insulator (POI), may be etched to form the flaps 301*a* and 303*a*. A layer of piezoelectric material, such as lead zirconate titanate (PZT), may be deposited atop the flap pair 302*a* to form the actuators 301*a*A and 303*a*A.

Whether an AFG device is top-firing or side-firing may influence the direction(s) of airflow(s) within its protective case. A top-firing AFG device (e.g., 300*a*) refers to a configuration in which an opening (e.g., 317*a*) is formed on the top of its cap structure (e.g., 311*a*). The top-firing AFG device may produce the net airflow in the direction +Z or −Z, aligned with the main direction of the movement of flaps of the AFG device. A side-firing AFG device features an opening formed on a sidewall of its cap structure.

More broadly speaking, the locations of openings of an AFG device may influence the direction(s) of airflow(s) within its protective case. For example, FIG. 3(*b*) is a cross-sectional-view schematic diagram of an AFG device 300*b* according to an embodiment of the present invention. The AFG device 300*b* may be used to implement, for example, the AFG device 100. The AFG device 300*a* and 300*b* may share similar mechanisms; however, an opening 316*b* of the AFG device 300*b* is formed on its supporting structure 321*b*, which is perpendicular to its supporting board 310*b*. Air pulses generated by a film structure 304*b* of the AFG device 300*b* produce a net airflow 300*b*F constantly in a single direction (e.g., +Z), and the net airflow 300*b*F in turn induces airflows 300*b*F' and 300*b*F". The direction (e.g., ±Z) of the airflow 300*b*F' passing through an opening 317*b* may be perpendicular to the direction (e.g., ±X) of the airflow 300*b*F" passing through the opening 316*b*. These airflow interactions may influence the direction(s) of airflow(s) near the AFG device 300*a*.

Alternatively, FIG. 3(*c*) is a cross-sectional-view schematic diagram of an AFG device 300*c* according to an embodiment of the present invention. The AFG device 300*a* and 300*c* may have similar mechanisms; however, an opening 317*c* of the AFG device 300*c* is formed on a sidewall of its cap structure 311*c*. A net airflow 300*c*F, generated by air pulses from a film structure 304*c* of the AFG device 300*c* and directed constantly in a single direction (e.g., +Z), induces an airflow 300*c*F'. The direction (e.g., ±X) of the airflow 300*c*F' passing through the opening 317*c* may be perpendicular to the direction (e.g., ±Z) of the airflow 300*c*F passing through an opening 316*c*.

Alternatively, FIG. 3(*d*) is a cross-sectional-view schematic diagram of an AFG device 300*d* according to another embodiment of the present invention. The AFG device 300*d* may be used to implement, for example, the AFG device 200*a*. The AFG device 300*c* and 300*d* may share similar mechanisms; however, an opening 316*d* of the AFG device 300*d* is formed on a side surface of its supporting board 310*d*. A net airflow 300*d*F, generated by air pulses from a film structure 304*d* of the AFG device 300*d* and directed constantly in a single direction (e.g., +Z), induces airflows 300*d*F' and 300*d*F". In FIG. 3(*d*), the direction (e.g., ±X) of the airflow 300*d*F' passing through an opening 317*d* may be parallel to the direction (e.g., ±X) of the airflow 300*d*F" passing through the opening 316*d*. Alternatively, if the opening 316*d* is located on the side surface that is perpendicular to a sidewall of a cap structure 311*d* where another opening 317*d* is formed, the direction (e.g., ±Y) of the airflow 300*d*F' passing through the opening 317*d* may be perpendicular to the direction (e.g., ±X) of the airflow 300*d*F" passing through the opening 316*d*.

Figure 4:
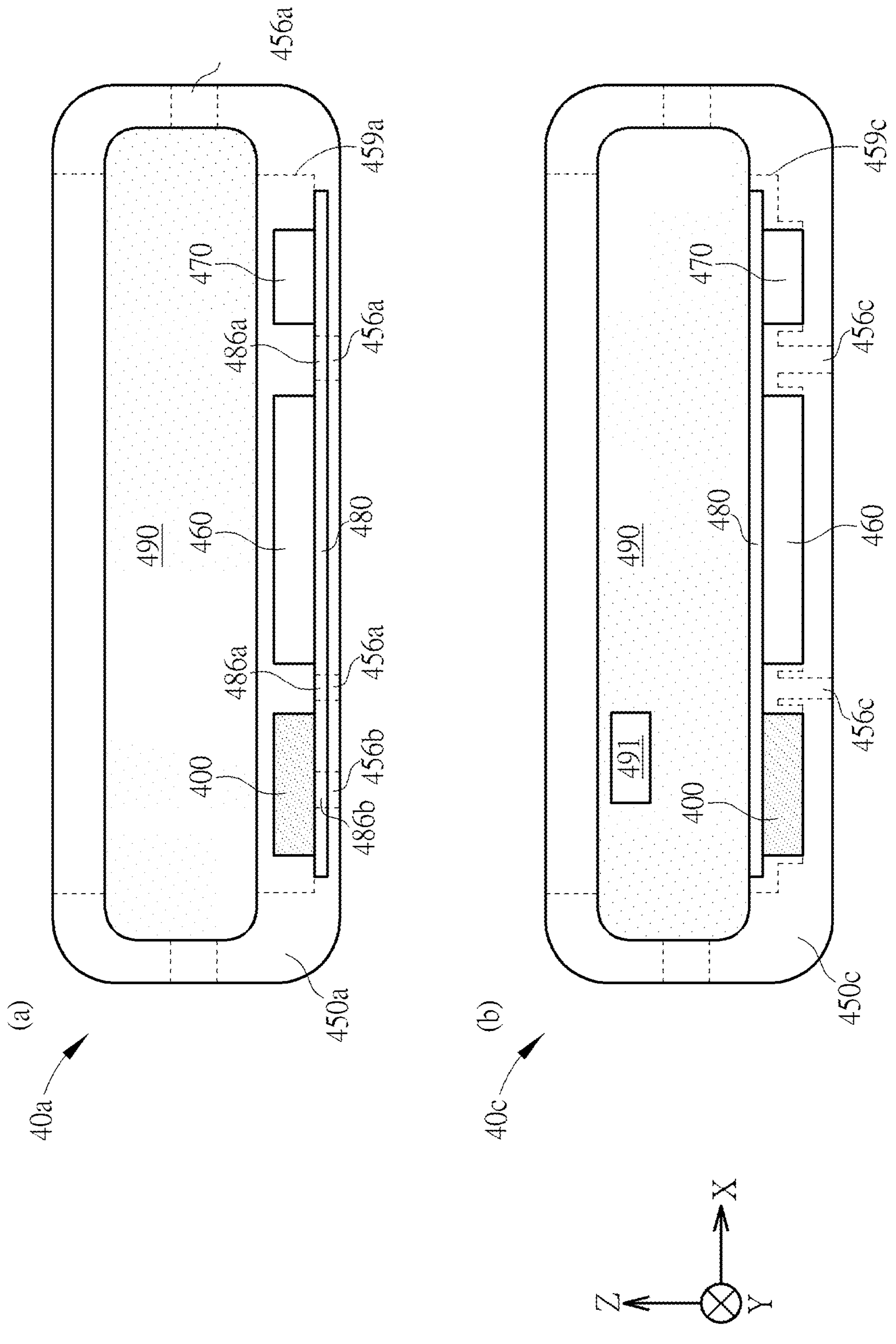
FIG. 4 illustrates side-view schematic diagrams of protective cases according to embodiments of the present invention.

In order to provide power for activating an AFG device 400, as shown in FIG. 4(*a*), which is a side-view schematic diagram of a protective case 40*a* according to an embodiment of the present invention, the AFG device 400 may be coupled to a power source 460 (e.g., a battery, a solar cell, or a near field communication (NFC) wireless charger), where the power source 460 may provide electric power to the AFG device 400. The location of the power source 460 may depend on factors such as the position of the AFG device 400 or the location of a component 491 of a portable electronic device 490 (e.g., an antenna, a processor, or a battery of the portable electronic device 490). For example, the NFC wireless charger of the AFG device 400 may be positioned corresponding to the location of an NFC wireless charger of the portable electronic device 490. Alternatively, the power source 460 may be positioned far from a processor or a battery of the portable electronic device 490. Alternatively, the power source 460 may be omitted if the protective case 40*a* can be connected to a battery of the portable electronic device 490.

A component 470 may be added to the protective case 40*a* to provide advanced function(s). For example, the component 470 may be a temperature sensor configured to detect the temperature near the portable electronic device 490. The component 470 may transmit a signal related to the sensed temperature to the AFG device 400 so as to selectively activate/deactivate the AFG device 400 based on the temperature conditions. Alternatively, the component 470 may be a controller configured to identify hot spots within the housing or to control the operation of the AFG device. For example, the component 470 may activate/deactivate certain AFG device(s) or adjust the strength of the airflow generated by an AFG device to regulate the ambient temperature. The location of the component 470 may depend on factors such as the position of the AFG device 400 or the location of the component 491. For example, the component 470 may be positioned near the processor of the portable electronic device 490 but distant from the AFG device 400.

A substrate 480 (e.g., a printed circuit board (PCB), a flexible printed circuit (FPC), or the supporting board 310*a* shown in FIG. 3) may be configured to support the AFG device 400, the power source 460, or the component 470 disposed thereon. Wiring interconnecting the AFG device 400, the power source 460, or the component 470 may facilitate power delivery to the AFG device 400 or the component 470, while also enabling communication between the AFG device 400 and the component 470. Moreover, the substrate 480 may comprise opening(s) 486*a* or 486*b*, positioned corresponding to opening(s) 456*a* or 456*b* of a housing 450*a* to create airflow path(s) from the bottom of the housing 450*a* to the AFG device 400. In this manner, cold air entering through the opening(s) 486*a* or 486*b* may be heated by the portable electronic device 490, and the heated air may exit the housing 450*a* through the opening(s) 486*b* or 486*a*.

The configuration of an AFG device may be inverted. For example, in FIG. 4(*a*), the AFG device 400, the power source 460, or the component 470 is disposed on the substrate 480, which is positioned between the AFG device 400 and the housing 450*a*. However, in FIG. 4(*b*), which is a side-view schematic diagram of a protective case 40*c* according to an embodiment of the present invention, the AFG device 400, the power source 460, or the component 470 is disposed between the substrate 480 and a housing 450*c*. The structure of a recess 459*c* of the housing 450*c*, unlike that of a recess 459*a* of the housing 450*a*, may depend on factors such as the shape of the AFG device 400, the power source 460, or the component 470. The recess 459*a* or 459*b*, or the space between the portable electronic device 490 and the housing 450*a* or 450*b*, may form channel(s) to guide air within the housing 450*a* or 450*b*.

A protective case may comprise several AFG devices with the same or different shape(s) or size(s). For example, in FIG. 5(*a*), which is a top-view schematic diagram of a protective case 50*d* according to an embodiment of the present invention, the protective case 50*d* comprises AFG devices 500*a*, 500*b*, and 500*c*, arranged in different arrays. Optionally, the number of AFG devices may be fewer than the number of openings of a housing 550*d*. Optionally, the number (e.g., 8) of AFG devices (e.g., 500*a*, 500*b*, and 500*c*) or the number of their arrays may be a function of the temperature or the power density of a portable electronic device.

The location/distribution of AFG devices (e.g., the distance between two adjacent AFG devices or two adjacent arrays) may depend on factors such as the temperature or the power density of a portable electronic device, or the location of a battery, an antenna, or a processor of the portable electronic device. For example, more AFG devices may be positioned near a battery or a processor of the portable electronic device, while fewer may be proximate to an antenna of the portable electronic device.

AFG device(s) of a protective case may feature identical or different structure(s) or operation(s). For example, FIG. 5(*b*) illustrates a top-view schematic diagram of a protective case 50*g* according to an embodiment of the present invention.

In an embodiment, the structures and operations of two adjacent flap pairs may be identical. For example, two flaps 501*e* and 503*e*, which are opposite to each other to constitute a flap pair 502*e* of the AFG device 500*e*, are actuated to move in opposite directions to create a VV between them. Similarly, the adjacent flap pair 506*e* may also be actuated to form a VV between its flaps 507*e* and 505*e*, with the flap 505*e* positioned next to the flap 503*e* without a slit in between. Because of the similarity, all the VVs of AFG device 500*e* may be closed at the same time, and likewise, they may be opened concurrently. As the adjacent flaps 503*e* and 505*e* of the two neighboring flap pairs 502*e* and 506*e* moves in opposite directions with their bottom electrodes electrically connected, current would flow between the two neighboring flap pairs 502*e* and 506*e*, which contributes to a reduction in overall power consumption.

In an embodiment, the structures and operations of two adjacent flap pairs may differ. For example, a flap pair 502*f* of the AFG device 500*f* may generate (first) air pulses toward the opening 556*f* in response to demodulation signals and a modulation signal, while a flap pair 506*f* of the AFG device 500*f* may generate (second) air pulses toward the same opening 556*f* in response to different demodulation signals and another modulation signal. A demodulation signal for a flap (e.g., 501*f*) of the flap pair 502*f* may be a delayed version of a demodulation signal for a flap (e.g., 505*f*) of the flap pair 506*f* (e.g., delayed by $T_{CY}/2$, half of the operating cycle time $T_{CY}$). Moreover, the modulation signal of the flap pair 502*f* may be viewed as the inverse of or a polarity-inverted version of the modulation signal of the flap pair 506*f*. Correspondingly, the first air pulses and the second air pulses may be mutually and temporally interleaved to increase (e.g., double) the pulse rate.

Figure 5:
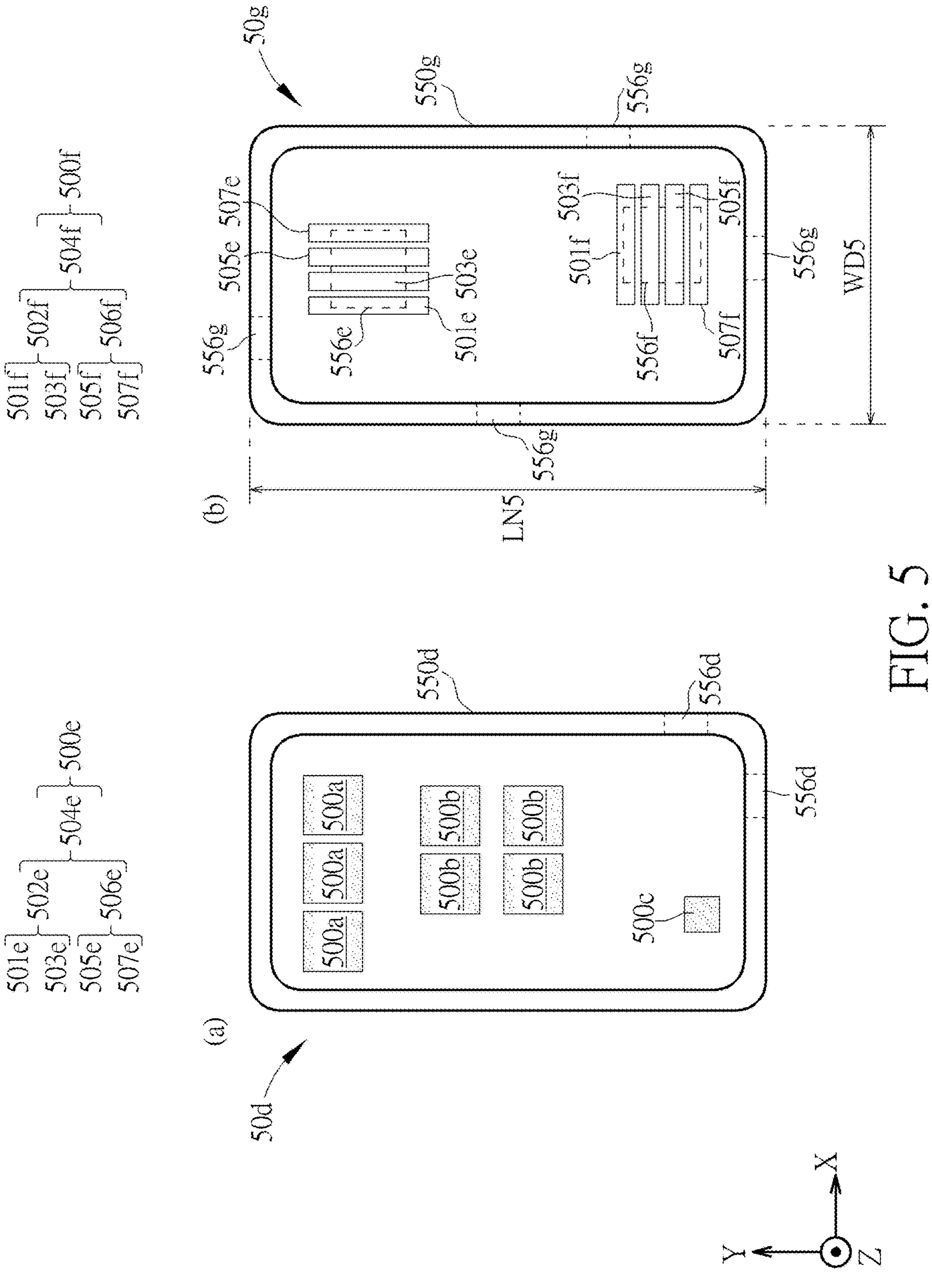
FIG. 5 illustrates top-view schematic diagrams of protective cases according to embodiments of the present invention.

As shown in FIG. 5(*b*), film structures 504*e* and 504*f*, disposed above openings 556*e* and 556*f* of a housing 550*g*, differ in configuration. Specifically, the orientation of a flap pair (e.g., 506*e*) of an AFG device 500*e* is different from that of a flap pair (e.g., 506*f*) of an AFG device 500*f*. For example, the symmetry plane of a flap (e.g., 507*e*) in the AFG device 500*e* is perpendicular to the symmetry plane of a flap (e.g., 507*f*) in the AFG device 500*f*. This may help reduce resonance.

Apart from the orientations, the operations of two flap pairs in different AFG devices may differ. For example, in an embodiment, a demodulation or modulation signal for a flap (e.g., 501*e*) of the flap pair 502*e* may be a delayed version of a demodulation or modulation signal for a flap (e.g., 501*f*) of the flap pair 502*f*. In an embodiment, the AFG device 500*e* may generate air pulses toward the opening 556*e*, producing a net (first) airflow constantly in a (first) single direction. On the other hand, the AFG device 500*f* may generate air pulses away from the opening 556*f*, producing a net (second) airflow constantly in a (second) single direction. The first single direction (e.g., +Z) may be the same as or different from the second single direction (e.g., +Z or −Z).

Figure 6:
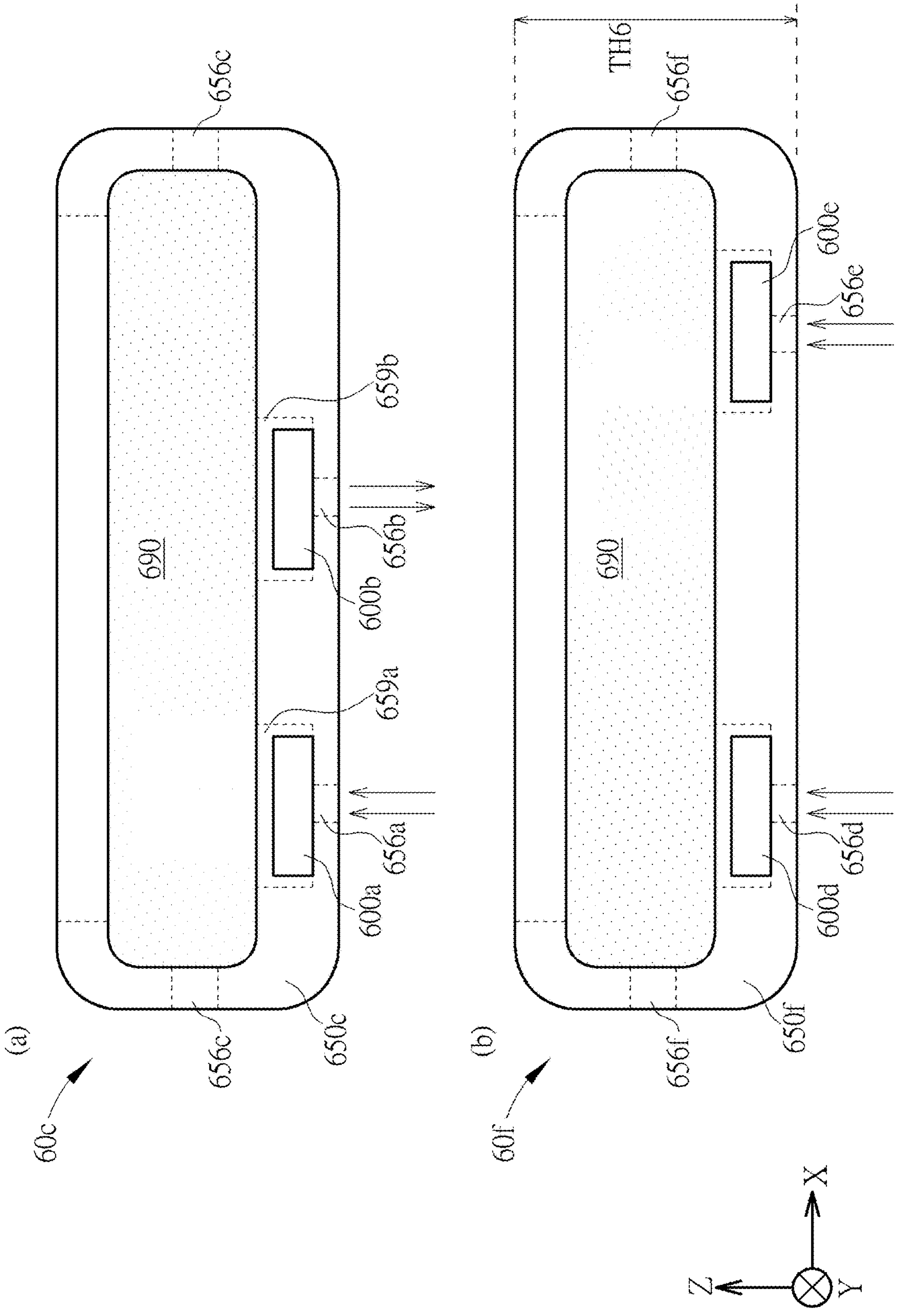
FIG. 6 illustrates side-view schematic diagrams of protective cases according to embodiments of the present invention.

For example, as shown in FIG. 6(*a*), which is a side-view schematic diagram of a protective case 60*c* according to an embodiment of the present invention, AFG devices 600*a* and 600*b* may produce airflows in opposite directions. In this manner, the airflow created by the AFG device 600*a* may enter a housing 650*c* through an opening 656*a*, introducing cold air (e.g., at ambient temperature) into the housing 650*c*. The cold air may then travel through the housing 650*c* to absorb heat. The heated air may subsequently be drawn out of the housing 650*c* by the AFG device 600*b* via an opening 656*b*. This push-pull configuration may facilitate heat dissipation.

For example, as shown in FIG. 6(*b*), which is a side-view schematic diagram of a protective case 60*f* according to an embodiment of the present invention, AFG devices 600*d* and 600*e* may produce airflows continuously in the same direction (e.g., −Z or +Z) to pull cold air into a housing 650*f* or push heated air out of the housing 650*f*. Corresponding to the airflows created by the AFG devices 600*d* and 600*e*, air may flow into (or out of) the housing 650*f* through opening(s) 656*f*. In other words, even AFG devices operating in the same direction can help remove excess heat from a portable electronic device 690.

Geometric features of an AFG device or a housing may be associated with or independent of resonance or the ultrasonic carrier frequency $f_{UC}$. Optionally, a length (e.g., LN5), a width (e.g., WD5), or a thickness TH6 of the housing 650*f* may differ substantially from a multiple of one-quarter of the wavelength $\lambda_{UC}$ corresponding to the ultrasonic carrier frequency $f_{UC}$. Optionally, a slit between flaps (e.g., 501*e* and 503*e*) may be positioned such that it does not align with antinode(s) or node(s) of the resonance of the housing 650*c*. Optionally, a film structure (e.g., 504*e*) may be driven at or near its resonance to reduce power consumption.

The shockproof structure of a housing may be improved after AFG device(s) is/are added. For example, the housing 650*c* in FIG. 6(*a*) comprises recesses 659*a* and 659*b*, in which the AFG devices 600*a* and 600*b* reside, to form a three-dimensional patterned structure inside. This structure may not only create airflow path(s) but also provide sufficient buffer space or shock absorption for the portable electronic device 690 or minimize structural resonance.

Geometric features of a housing and its AFG device(s) are mutually influential and closely interconnected. For example, the location(s) of the opening(s) 656*c* or 656*f* may be related to the direction of an airflow created by an AFG device (e.g., 600*a*, 600*b*, 600*d*, or 600*e*), the position(s) of the AFG device(s) (e.g., 600*a*, 600*b*, 600*d*, or 600*e*), or the region where a user holds the protective case. Optionally, if the AFG device 600*a* draws cold air into the housing 650*c* and the AFG device 600*b* expels heated air from it, the opening(s) 656*c* may be omitted. Optionally, the opening(s) 656*f* may be located away from the holding region intended user handling, and the AFG device(s) near the holding region may be side-firing.

An AFG device may be small, relative to the portable electronic device 690 (or its battery). The portable electronic device 690 (or its battery or processor) may completely overlap a compact AFG device (e.g., 600*d*). Because of the small size of an AFG device (e.g., 10-15 millimeters in length, 10-15 millimeters in width, and 2-3 millimeters in thickness), the housing 650*f* may also be made thin.

The use of ordinal terms such as "first" and "second" does not by itself imply any priority, precedence, or order of one element over another, the chronological sequence in which acts of a method are performed, or the necessity for all the elements to be exist at the same time, but these terms are simply used as labels to distinguish one element having a certain name from another element having the same name.

The term "substantially" generally implies that a small deviation may or may not present. For instance, the term "substantially parallel" or "substantially along" indicates that the angle between two components may be less than or equal to a certain threshold (e.g., 5, 1, or 0.1 degrees). The term "substantially aligned" indicates that a deviation between two components may be less than or equal to a certain threshold (e.g., 1 or 0.1 micrometers or milliseconds). The term "substantially the same" indicates that a deviation falls within a certain percentage (e.g., 5%, 1%, or 0.1%).

The technical features described in the following embodiments may be mixed or combined in various ways as long as there are no conflicts between them.

To sum up, AFG device(s) is/are mounted inside a protective case facing a portable electronic device to generate airflow(s) between the protective case and the portable electronic device, thereby efficiently cooling the portable electronic device without adversely affecting performance. To enhance cooling efficiency, the protective case may be equipped with a temperature sensor or an independent power source, which may also be mounted inside the protective case facing the portable electronic device. Additionally, geometric features (e.g., openings or channels) of the protective case may be designed in association with the AFG device(s) to facilitate airflow(s) and enhance structural strength. In other words, by providing external active cooling and protective covering functions, the protective case improves performance and reliability of the portable electronic device without requiring modifications to its internal configuration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A protective case, for a portable electronic device, comprising:
- a housing, adapted to accommodate the portable electronic device; and
- an airflow generating device, integrated in the housing;
- wherein the airflow generating device is configured to face the portable electronic device to generate a plurality of air pulses toward or away from the portable electronic device;
- wherein the protective case is configured to be detachable from the portable electronic device.

2. The protective case of claim 1,
- wherein a first surface of the airflow generating device is in contact with an inner surface of the housing;
- wherein a second surface of the airflow generating device is opposite to the first surface;
- wherein the second surface, which is proximal to the portable electronic device, is in contact with or spaced apart from the portable electronic device.

3. The protective case of claim 1, wherein an opening of the airflow generating device is aligned with or near an opening of the housing.

4. The protective case of claim 1, wherein the airflow generating device is disposed in a recess of the housing.

5. The protective case of claim 1, wherein a number of at least one airflow generating device is fewer than a number of openings of the housing;

wherein the at least one airflow generating device comprises the airflow generating device.

6. The protective case of claim 1, further comprising:

a temperature sensor, wherein the airflow generating device is configured to receive a signal related to temperature measured by the temperature sensor.

7. The protective case of claim 1, further comprising:

a power source, configured to provide electric power to the airflow generating device.

8. The protective case of claim 1, wherein a location of the airflow generating device or one single direction is determined according to a location of a battery, an antenna, or a processor of the portable electronic device.

9. The protective case of claim 1, wherein a film structure of the airflow generating device is configured to be actuated to generate the plurality of air pulses at an ultrasonic pulse rate;

wherein the plurality of air pulses produce a net airflow constantly in one single direction.

10. The protective case of claim 9, wherein a flap pair of the film structure comprises a first flap and a second flap opposite to each other;

wherein the flap pair is configured to perform a differential-mode movement and to form a virtual valve or an opening at an ultrasonic opening rate which is synchronous with the ultrasonic pulse rate;

wherein the virtual valve is closed within a period corresponding to a first transition time of the first flap and a second transition time of the second flap.

11. The protective case of claim 1, further comprising:

a first airflow generating device, integrated in the housing;

wherein the airflow generating device and the first airflow generating device are configured to produce airflows in opposite directions.

12. The protective case of claim 1, wherein a first flap and a second flap of the airflow generating device are configured to be substantially parallel to a display screen of the portable electronic device when a virtual valve formed between the first flap and the second flap is closed.

13. An airflow generating method, for a portable electronic device, comprising:

producing an airflow; and causing air to move within a housing of a protective case;

wherein an airflow generating device of the protective case is integrated into the housing adapted to accommodate the portable electronic device;

wherein the airflow generating device is configured to face the portable electronic device to generate a plurality of air pulses toward or away from the portable electronic device;

wherein the protective case is configured to be detachable from the portable electronic device.

14. The airflow generating method of claim 13, wherein a first surface of the airflow generating device is in contact with an inner surface of the housing;

wherein a second surface of the airflow generating device is opposite to the first surface;

wherein the second surface, which is proximal to the portable electronic device, is in contact with or spaced apart from the portable electronic device.

15. The airflow generating method of claim 13, wherein an opening of the airflow generating device is aligned with or near an opening of the housing.

16. The airflow generating method of claim 13, wherein the airflow generating device is disposed in a recess of the housing.

17. The airflow generating method of claim 13, wherein a number of at least one airflow generating device is fewer than a number of openings of the housing;

wherein the at least one airflow generating device comprises the airflow generating device.

18. The airflow generating method of claim 13, wherein the protective case further comprises a temperature sensor;

wherein the airflow generating device is configured to receive a signal related to temperature measured by the temperature sensor.

19. The airflow generating method of claim 13, wherein the protective case further comprises a power source, configured to provide electric power to the airflow generating device.

20. The airflow generating method of claim 13, wherein a location of the airflow generating device or one single direction is determined according to a location of a battery, an antenna, or a processor of the portable electronic device.

21. The airflow generating method of claim 13, wherein a flap pair of a film structure comprises a first flap and a second flap opposite to each other;

wherein the flap pair is configured to perform a differential-mode movement and to form a virtual valve or an opening at an ultrasonic opening rate which is synchronous with an ultrasonic pulse rate;

wherein the virtual valve is closed within a period corresponding to a first transition time of the first flap and a second transition time of the second flap.

* * * * *